United States Patent
Yoshida et al.

[11] Patent Number: 6,166,941
[45] Date of Patent: Dec. 26, 2000

[54] RELAXED LAYOUT FOR STORAGE NODES FOR DYNAMIC RANDOM ACCESS MEMORIES

[75] Inventors: Hiroyuki Yoshida; Toshiyuki Nagata, both of Plano, Tex.

[73] Assignee: Texas Instruments Incorporated, Dallas, Tex.

[21] Appl. No.: 09/329,664

[22] Filed: Jun. 10, 1999

Related U.S. Application Data

[60] Provisional application No. 60/090,890, Jun. 26, 1998.

[51] Int. Cl.$^7$ ...................................................... G11C 5/02
[52] U.S. Cl. ................................................ 365/63; 365/51
[58] Field of Search ................................. 365/63, 51, 52, 365/149

[56] References Cited

U.S. PATENT DOCUMENTS

| | | | |
|---|---|---|---|
| 5,315,542 | 5/1994 | Melzner | 365/63 |
| 5,383,151 | 1/1995 | Onishi et al. | 365/63 |
| 5,566,104 | 10/1996 | Shinkawata | 365/51 |
| 6,026,010 | 2/2000 | Ema et al. | 365/63 |

FOREIGN PATENT DOCUMENTS

| | | | |
|---|---|---|---|
| 0 369 132 | 9/1989 | European Pat. Off. | H01L 27/108 |
| 0 399 531 | 5/1990 | European Pat. Off. | H01L 27/108 |
| 0 756 327 A1 | 8/1990 | European Pat. Off. | H01L 27/108 |

*Primary Examiner*—Tan T. Nguyen
*Attorney, Agent, or Firm*—Jacqueline J. Garner; W. James Brady III; Frederick J. Telecky, Jr.

[57] ABSTRACT

A memory cell structure (10) includes a plurality of bit lines (12) and intersecting word lines (14). Bit line contacts (16) are spaced evenly apart on an associated bit line (12). A plurality of storage nodes (20) and associated storage node contacts (18) are provided. Storage nodes (20) and storage node contacts (2) are spaced evenly apart along the associated bit line (12). The storage nodes (20) and storage node contacts (18) are offset with respect to storage nodes (20) and storage node contacts (18) placed along adjacent bit lines (12).

10 Claims, 1 Drawing Sheet

6,166,941

RELAXED LAYOUT FOR STORAGE NODES FOR DYNAMIC RANDOM ACCESS MEMORIES

This application claims priority under 35 USC §119(e)(1) of provisional application number 60/090,890 filed Jun. 26, 1998.

TECHNICAL FIELD OF THE INVENTION

This invention relates to the field of solid state electronic devices and more specifically to a relaxed layout of storage nodes for dynamic random access memories.

BACKGROUND OF THE INVENTION

Modern microprocessor-based systems rely on memories for their operation in order to store programs and data for processing. As microprocessor-based systems become more sophisticated, larger memories are required. While larger memories are required, it is also desirable to have memories which are small in size and easy to manufacture. One popular type of memory array is a dynamic random access memory (DRAM) in which memory cells retain information only temporarily and must be refreshed at periodic intervals. Despite this limitation, DRAMs are widely used because they provide low cost per bit, high device density and feasibility of use.

In a DRAM, each memory cell typically includes an access transistor coupled to a storage capacitor. The memory cells are accessed by a series of intersecting word and bit lines connected to the access transistor. Word lines control the access transistors to allow the bit lines to read data into and out of the storage capacitors. In a conventional memory cell, there are a plurality of bit line contacts spaced equally apart along the bit lines. Bit line contacts are the contacts between the bit line and the access transistor. Also spaced evenly apart either over or under a bit line are a plurality of storage nodes. This is where the actual charge is stored in a memory cell. Associated with these storage nodes is a storage node contact. A storage node contact is a contact between an access transistor and the storage node or storage capacitor. In a typical memory cell structure, storage node contacts are in line with each other as one moves from one adjacent bit line to another. However, storage nodes, which are typically oval or oblong in shape, are offset slightly as one moves from one bit line to a next adjacent bit line. This is due to the fact that if storage nodes were not offset, they could touch a bit line contact resulting in a short in the memory cell. The storage nodes themselves are typically oblong or oval because other shapes would risk touching storage nodes from adjacent bit lines also causing a short.

This arrangement leads to crowded cell structures. Crowded cell structures make it difficult to manufacture the memory cell. To alleviate this situation, it is possible to increase the number of exposures during lithography or increase the cell size. However, increasing the exposure time during lithography increases the length of time to manufacture the DRAM. Increasing the cell size will make the size of the chip larger. Both of these approaches lead to increased cost as well as inefficient memory structures.

SUMMARY OF THE INVENTION

Accordingly, it may be appreciated that a need has arisen for a relaxed layout of storage nodes for a dynamic random access memory in accordance with the teachings of the present invention. A relaxed layout of storage nodes for a dynamic random access memory is provided which substantially eliminates or reduces the disadvantages and problems associated with current layouts of storage nodes for dynamic random access memories.

In one embodiment of the present invention, a memory cell structure is provided. The memory cell structure comprises a plurality of bit lines intersected by a plurality of word lines. Also included are bit line contacts spaced an equal amount apart on a given bit line. Additionally, a plurality of storage node contacts spaced apart essentially in line with a given bit line are provided. Associated with those storage node contacts are a plurality of storage nodes spaced an equal amount apart along a given bit line. In this embodiment, the storage node along a given bit line is shifted by a set amount with respect to the storage node placed on an adjacent bit line.

The present invention provides various technical advantages over current layouts of storage nodes for dynamic random access memories. For example, one technical advantage is the ease of manufacturing given a relaxed layout. Another technical advantage is the ability to provide a circular storage node which allows for a more relaxed layout in a memory cell structure. Other technical advantages may be readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, in which like reference numbers represent like parts, wherein.

DETAILED DESCRIPTION OF THE INVENTION

Figure 1:
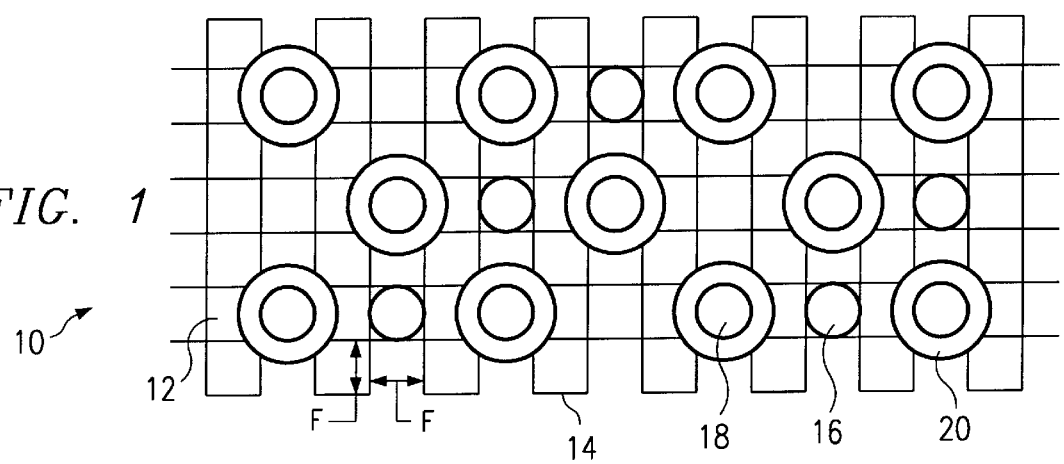
FIG. 1 illustrates a memory cell structure.

FIG. 1 shows a memory cell structure 10. Memory cell structure 10 comprises a plurality of bit lines 12 intersected by a plurality of word lines 14. Also illustrated are a plurality of bit line contacts 16 as well as a plurality of storage nodes 20 and storage node contacts 18.

Word lines 14 control the access transistors to allow bit lines 12 to read data into and out of the storage capacitors or storage nodes 20. Bit line contacts 16 are the contacts between bit line 12 and an access transistor. Storage node contacts 20 are the contacts between an access transistor and the storage capacitor or storage node 20. In an exemplary embodiment, the width of bit line 12 is a fixed amount represented by the letter F which is known as the feature length. This feature length, F, is also the width of memory cell structure word line 14 and the spacing between word lines 14 and between bit lines 12. Feature length F depends upon the type of memory and the application within which that memory cell structure 10 is used. A typical feature length is approximately two tenths of a micrometer (0.20 $\mu$m) in length. The distance represented by eight times the feature length is known as one pitch.

As can be seen in FIG. 1, bit line contacts 16 are spaced eight feature lengths or one pitch apart along a given bit line. Each bit line contact 16 associated with a given bit line 12 is shifted one-quarter of a pitch with respect to an adjacent bit line 12. In a given bit line 12, a bit line contact 16 is associated with at least two storage nodes 20 and at least two associated node contacts 18. Storage nodes 20 are spaced one-half pitch apart along bit line 12 with which they are associated. Storage node 20 and storage node contact 18 are not located in the same position on a given bit line 12 with respect to an adjacent bit line 12. Instead, storage node 20 and storage node contact 18 associated with a given bit line 12 are shifted by one-quarter of a pitch when compared to storage node 20 and storage node contact 18 associated with an adjacent bit line 12. This provides a symmetrical layout with a relaxed pattern as compared to existing cell structures.

Storage nodes 20 are essentially circular in shape. This essentially circular shape also results in a relaxed pattern for easier manufacturing.

In one embodiment, storage nodes 20 are spaced four feature lengths or one-half pitch apart along an associated bit line 12. It is possible to space storage nodes 20 closer together. However, as storage nodes 20 move closer together, they begin to impinge upon bit line contacts 16. If storage nodes 20 are spaced too close together, they may touch bit line contact 16 resulting in a short. Also, storage nodes 20 could be spaced further apart than one-half pitch along an associated bit line 12. However, if storage nodes 20 are placed further apart, a larger cell size results and defeats the purpose of developing smaller memory cells.

Figure 2:
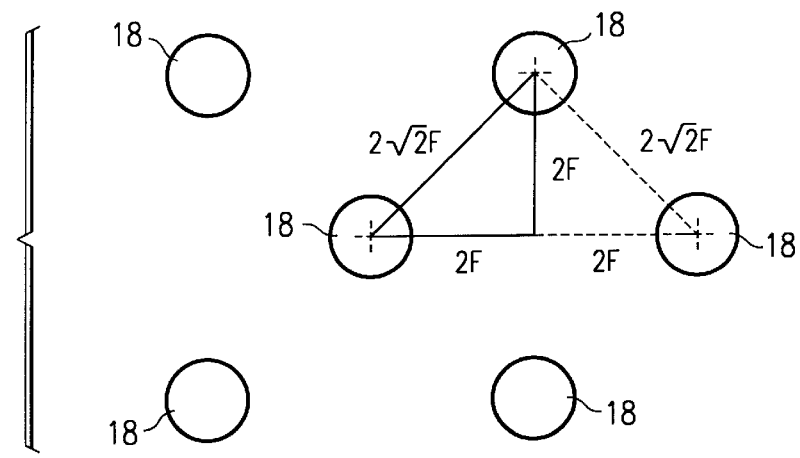
FIG. 2 illustrates spacing of the storage node contacts in the memory cell structure.

FIG. 2 shows the spacing of storage node contacts 18. In a given associated bit line 12, storage node contacts 18 are spaced four feature lengths apart. With respect to adjacent bit lines 12, storage node contacts 18 are spaced two times the square root of two, times the feature length, apart. This increases the spacing between storage node contacts along adjacent bit lines 12 over previous memory cell arrangements. The end result is an easier to manufacture memory cell due to an increased geometry in the memory cell.

Figure 3:
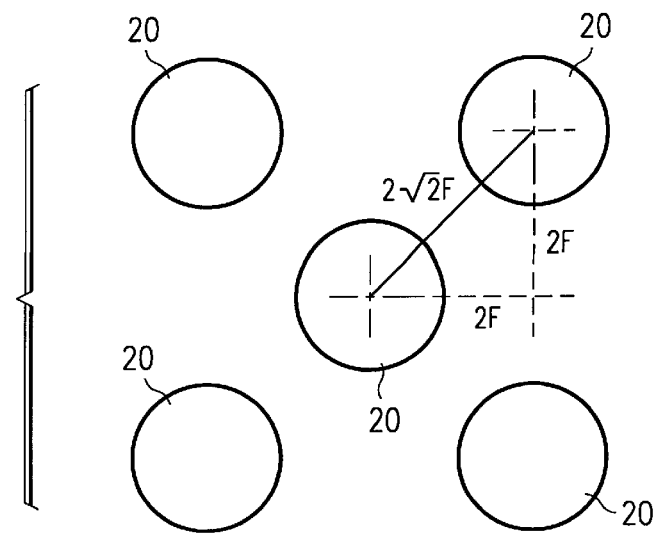
FIG. 3 illustrates the spacing of the storage nodes in the memory cell structure.

FIG. 3 shows the spacing of storage nodes 20. In a given associated bit line 12, it can be seen that storage nodes 20 are spaced four feature lengths apart. However, storage nodes 20 are spaced two times the square root of two, times the feature length, apart from one associated bit line 12 to an adjacent associated bit line 12. This increases the distance between storage nodes 20 with respect to adjacent bit lines 12 from previous memory cell layouts. Again, this allows for a larger geometry in the cell structure which results in an easier to manufacture memory cell.

While the foregoing has been discussed with an embodiment drawn to dynamic random access memories (such as capacitor over bit line and capacitor under bit line types of memories), the same technique can be used for any essentially circular contact for any type of integrated circuit.

Thus, it is apparent that there has been provided, in accordance with the present invention, a relaxed layout for storage nodes for dynamic random access memories that satisfies the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. A memory cell structure, comprising:
   a plurality of bit lines extending in substantially a parallel fashion relative to one another along a surface of an integrated circuit;
   a plurality of word lines, extending along the surface of the integrated circuit substantially perpendicularly to the plurality of bit lines;
   a plurality of storage nodes disposed along and in contact with an associated one of the plurality of bit lines in such a manner that two of the plurality of word lines are disposed between each pair of adjacent storage nodes along a common bit line; and
   a plurality of bit line contacts, disposed along associated ones of the plurality of bit lines in such a manner that two of the plurality of storage nodes are disposed between each pair of adjacent bit line contacts along a common bit line, each bit line contact for making contact between its associated bit line and an access transistor defined by one of the plurality of word lines and coupled to an associated storage node;
   wherein the storage nodes along each of the bit lines are shifted with respect to storage nodes along an adjacent bit line, so that each of the bit line contacts along each of the plurality of bit lines is substantially aligned with one of the plurality of storage nodes along an adjacent bit line.

2. The memory cell structure of claim 1, wherein each of the word lines have a width corresponding to a selected feature size;
   wherein adjacent ones of the plurality of word lines are separated from one another by a distance corresponding to the selected feature size;
   and wherein adjacent ones of the bit line contacts along a common bit line are spaced apart from one another, center-to-center, by a distance corresponding to eight times the selected feature size.

3. The memory cell structure of claim 2, wherein each of the plurality of storage nodes makes contact to an access transistor at a storage node contact that is substantially concentric with the storage node;
   and wherein adjacent ones of the storage nodes along a common bit line are spaced apart from one another, center-to-center, by a distance corresponding to four times the selected feature size.

4. The memory cell structure of claim 2, wherein the storage nodes along each bit line are shifted by a distance corresponding to twice the selected feature size with respect to storage nodes on an adjacent associated bit line.

5. The memory cell structure of claim 2, wherein each of the bit lines have a width corresponding to the selected feature size;
   and wherein adjacent ones of the plurality of bit lines are separated from one another by a distance corresponding to the selected feature size.

6. The memory cell structure of claim 1, wherein the storage node is essentially circular in shape.

7. The memory cell structure of claim 6, wherein each of the plurality of storage nodes makes contact to an access transistor at a storage node contact that is substantially concentric with the storage node;
   and wherein each storage node contact is essentially circular in shape.

8. The memory cell structure of claim 1, wherein the memory cell structure is a stacked dynamically random access memory.

9. The memory cell structure of claim 1, wherein the memory cell structure is a capacitor over bit line type.

10. The memory cell structure of claim 1, wherein the memory cell structure is a capacitor under bit line type.

* * * * *